(12) United States Patent
Lin et al.

(10) Patent No.: US 10,878,855 B1
(45) Date of Patent: Dec. 29, 2020

(54) LOW CELL VOLTAGE (LCV) MEMORY WRITE ASSIST

(71) Applicant: Taiwan Semiconductor Manufacturing Company, Ltd., Hsinchu (TW)

(72) Inventors: Yangsyu Lin, Hsinchu (TW); Chiting Cheng, Hsinchu (TW); Wei-jer Hsieh, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

(21) Appl. No.: 16/573,416

(22) Filed: Sep. 17, 2019

(51) Int. Cl.
| G11C 5/14 | (2006.01) |
| G11C 11/419 | (2006.01) |
| G11C 5/06 | (2006.01) |
| G11C 11/418 | (2006.01) |

(52) U.S. Cl.
CPC .............. G11C 5/147 (2013.01); G11C 5/06 (2013.01); G11C 11/418 (2013.01); G11C 11/419 (2013.01)

(58) Field of Classification Search
CPC ......... G11C 5/147; G11C 11/418; G11C 5/06; G11C 11/419
USPC ........................................................ 365/226
See application file for complete search history.

(56) References Cited

U.S. PATENT DOCUMENTS

| 10,236,055 B1 * | 3/2019 | Kumar ................. G11C 11/419 |
| 2015/0206576 A1 * | 7/2015 | Gong ................... G11C 11/419 365/154 |
| 2017/0221904 A1 * | 8/2017 | Liaw ..................... H01L 23/528 |
| 2019/0147947 A1 * | 5/2019 | Yabuuchi .............. G11C 11/419 365/154 |

* cited by examiner

*Primary Examiner* — Fernando Hidalgo
(74) *Attorney, Agent, or Firm* — Merchant & Gould P.C.

(57) ABSTRACT

A charge sharing type lower-cell-voltage (LCV) write assist takes advantage of unused metal layers on top of a memory array to implement capacitance without incurring area costs. Only one-time fixed amount expenses of charge are needed for a given LCV level during the charge sharing phase of each write operation. Metal wires parallel to the bit cell power wires have good capacitance matching for charge sharing among all memory density configurations, thus benefitting memory compiler design.

20 Claims, 7 Drawing Sheets

LOW CELL VOLTAGE (LCV) MEMORY WRITE ASSIST

BACKGROUND

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node.

Write assist circuitry is utilized by memory devices to improve speed and ease of writing data to memory bit cells. A bias circuit to dynamically adjust the supplied power to a memory bit cell allows for faster and lower powered write operations. However, bias circuitry typically utilizes a constant lowered voltage by means of a constant current consumption during write cycles which consumes a large amount of active power across time. Additionally, the bias circuit occupies a large area on the memory device, thus negatively impacting memory density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
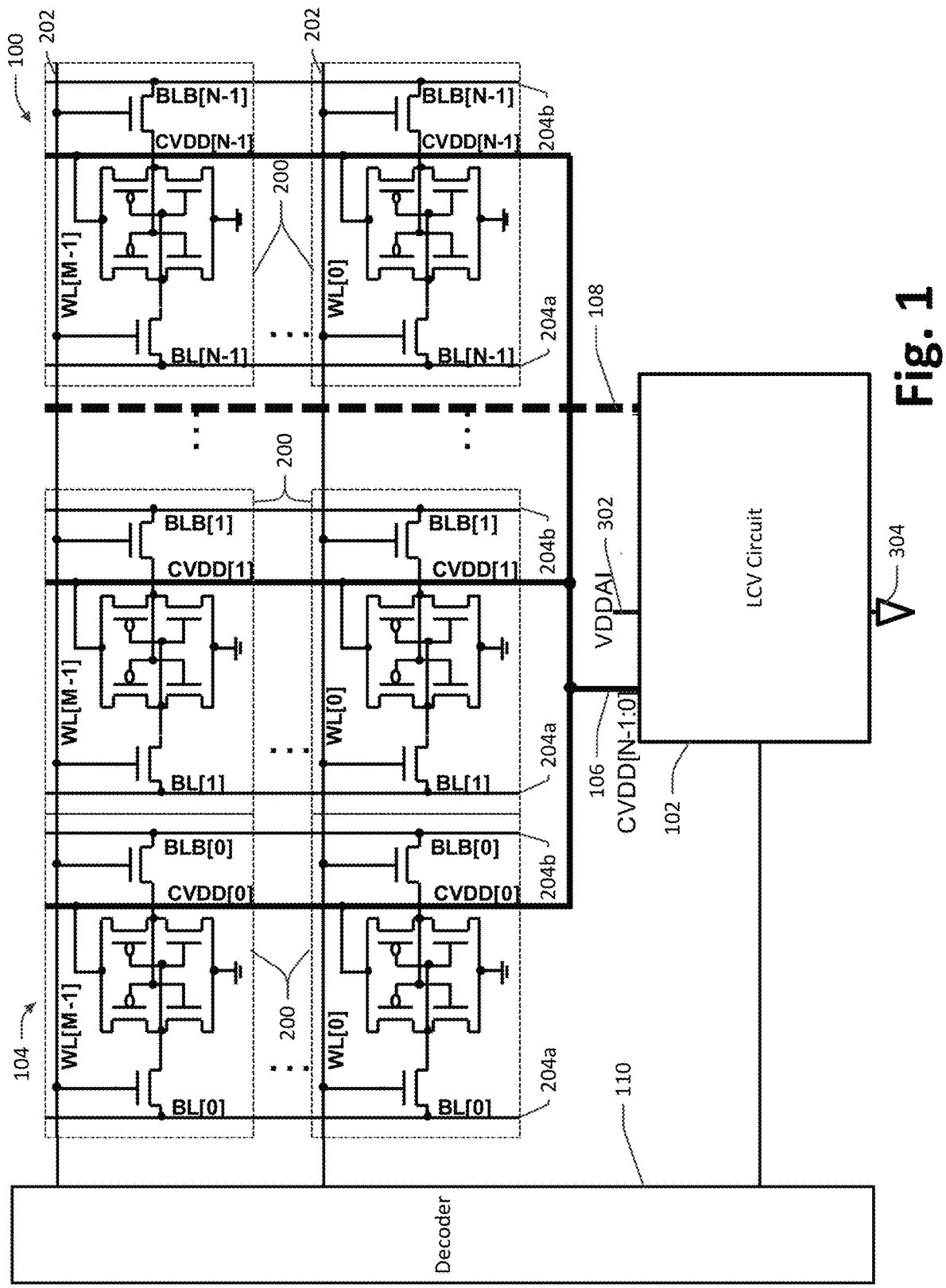
FIG. 1 is a block diagram depicting a memory device including a charge sharing lower-cell-voltage (LCV) circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a memory device 100 in accordance with disclosed examples. In the illustrated example, the memory device 100 is a static random access memory (SRAM), which has memory cells 200 arranged in an array 104 of rows and columns on a substrate. The illustrated example has M rows designated as rows [M-1:0], and N columns designated as columns [N-1:0] herein.

The SRAM bit cells 200 of the illustrated embodiment are 6T SRAM cells, for example, though other bit cell structures are within the scope of this disclosure. The memory cells 200 are connected via word lines 202 to a row decoder 110 configured to receive a memory address and output a memory address selection signal. The word lines 202 are configured to select a row in response to the memory address selection signal. Additionally, the memory cell array 104 contains complementary bit lines (BL) 204a and bit lines-bar (BLB) 204b (collectively bit lines 204) connecting the columns of a plurality of individual memory cells. Thus, the bit lines 204a, 204b of each column are respectively coupled to a plurality of memory cells 200 that are disposed in that column, and each memory cell 200 in that column is arranged on a different row and coupled to a respective word line 202. Typically, the bit lines 204a, 204b extend in one direction (parallel to a first axis) and the word lines 202 extend in a second direction (parallel to a second axis) perpendicular to the first direction. The bit lines 204a, 204b are configured to read data from and write data to the bit cells of a selected row.

Figure 2:
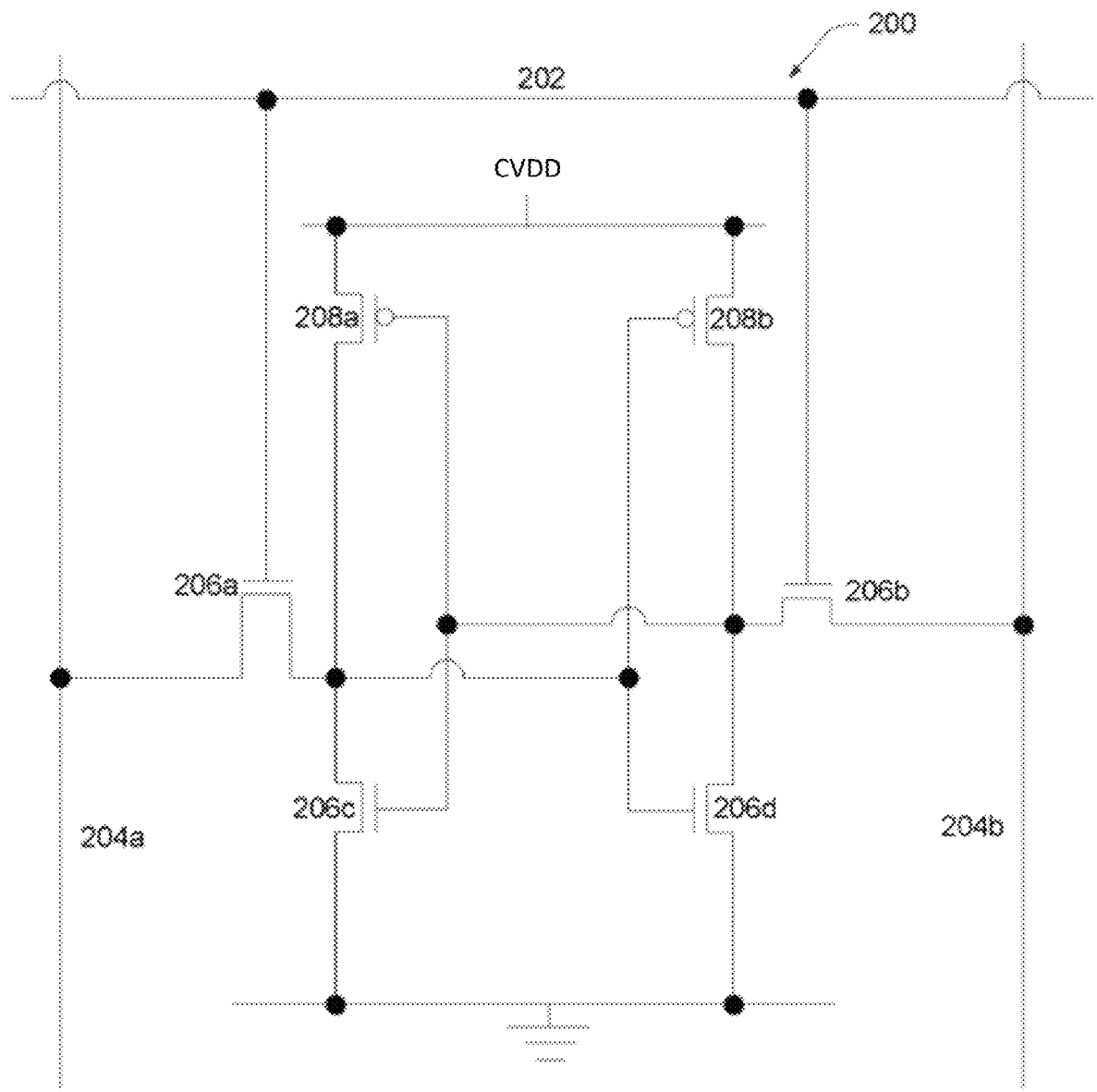
FIG. 2 is a circuit diagram of an example of a static random access memory (SRAM) cell of the device shown in FIG. 1 in accordance with some embodiments.

FIG. 2 illustrates an example of the SRAM memory cell 200 of the bit cell array 104 shown in FIG. 1. The memory cell 200 is connected to one of the word lines 202 and a pair of the complementary bit lines 204a and 204b. The memory cell 200 includes PMOS transistors 208a-b and NMOS transistors 206a-d. The transistors 208a and 206c are coupled to one another and positioned between the supply voltage CVDD and ground to form an inverter. Similarly, the transistors 208b and 206d are coupled between CVDD and ground to form a second inverter. The two inverters are cross-coupled to each other. An access, or pass gate transistor 206a connects the output of the first inverter to the bit line BL 204a. Similarly, an access transistor 206b connects the output of the second inverter to the bit line bar 204b. The word line 202 is attached to the gate controls of the access transistors 206a and 206b to selectively couple the outputs of the inverters to the bit lines 204a, 204b during read/write operations. During a read operation the inverters drive the complementary voltage levels at the bit lines 204a, 204b. The cross coupled inverters of the memory cell 200 provide two stable voltage states denoting logic values 0 and 1. Metal-Oxide Semiconductor Field Effect Transistors (MOS- FETs) are typically used as the transistors in the memory cell 200. In some embodiments more or fewer than 6 transistors may be used to implement the memory cell 200.

Some SRAM memory devices include a write assist circuit that allows data to be written to bit cells easier and more reliably than it would be without utilizing a write assist. A lower cell voltage (LCV) write assist operates by lowering the bit cell power supply voltage CVDD as compared to the a memory array power supply voltage VDDAI. The lowered voltage allows data on a bit line to be more easily and more quickly stored on a bit cell.

For instance, LCV write assists may shorten write data operation cycle time, resulting in faster writing speed. As long as the reduced supply voltage is not decreased so much as to impact signal integrity, noise margins, etc., thereby interfering with the integrity of a write data operation, the smaller transition between logical low and logical high voltage values associated with the reduced supply voltage range correspondingly take less time.

Some known LCV circuits employ a bias circuit to dynamically adjust the bit cell power supply during SRAM write operations. However, providing a constant lowered voltage using such bias circuits can consume a large amount of active power and occupy excessive area of the memory device.

Referring back to FIG. 1, the memory device 100 further includes an LCV control circuit 102 connected to each of the bit cells 200 via a bit cell power supply wire 106. The power supply wire 106 is configured to provide the bit cell power supply voltage CVDD to the bit cells 200. During read operations, the CVDD voltage level output to the bit cells 200 may be substantially the same as the array power supply voltage VDDAI. For write operations, the LCV charge sharing circuit 102 is configured to output a lower cell voltage to the bit cells 200.

As will be discussed further below, the bit cell power supply wire 106 is positioned in a first metal layer of the memory device 100. The LCV charge sharing circuit 102 is connected to a power supply input terminal 302 that that receives an array power supply voltage VDDAI, and to a ground terminal 304. The LCV charge sharing circuit 102 is operable to connect the bit cell power supply wires 106 to a charge sharing wire 108 formed in a second metal layer of the device 100, as will be discussed in further detail below. In some examples the charge sharing wire 108 is parallel to the bit lines 204a, 204b and the bit cell power supply wire 106. The bit cell power supply wire 106 and the charge sharing wire 108 extend parallel to one another in different metal layers and are thus separated by a dielectric, forming a capacitor. The charge sharing circuit 102 is configured to perform charge sharing using the capacitor formed by the power supply wire 106 and the charge sharing wire 108 to lower the bit cell supply voltage CVDD from the VDDAI level. The charge sharing circuit 102 is operable to selectively connect the power supply wire 106 and the charge sharing wire 108 in response to a memory address selection signal received by the decoder 110 and an enable signal, which is a clocked signal in some embodiments.

Figure 3:
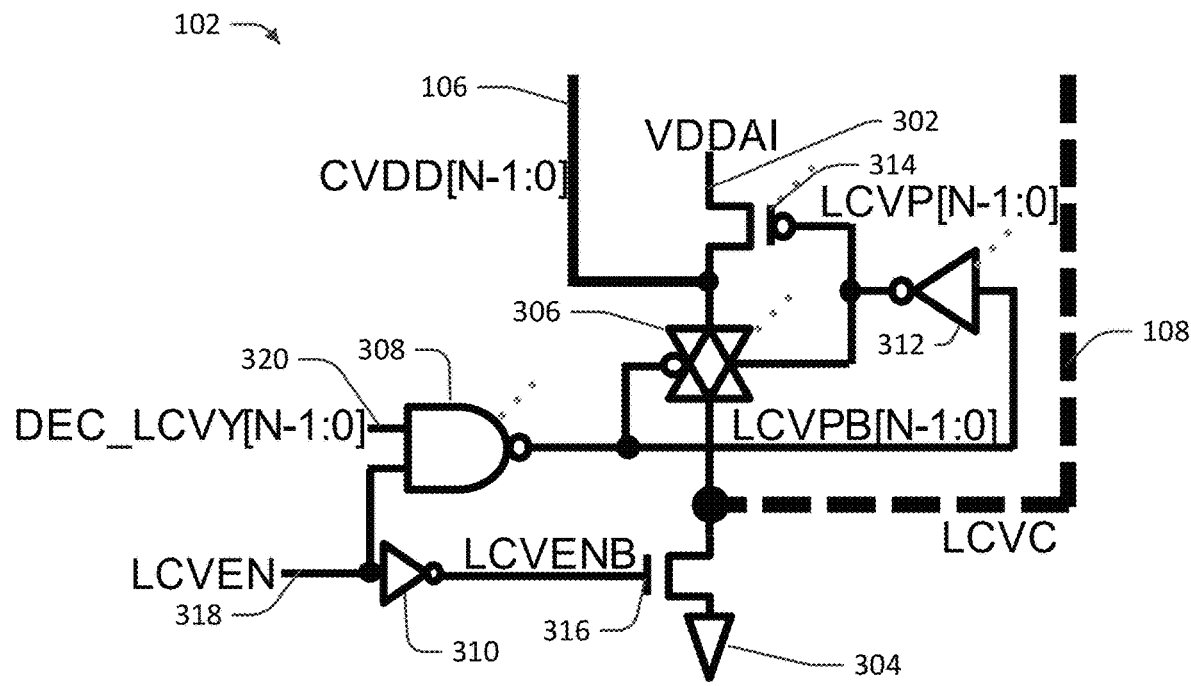
FIG. 3 is a circuit diagram showing an example of a charge sharing LCV circuit in accordance with some embodiments.

FIG. 3 is a circuit diagram illustrating an example embodiment of the LCV charge sharing circuit 102. The circuit 102 includes a power supply terminal 302 configured to receive the array power supply voltage VDDAI, and a ground terminal 304. The circuit 102 includes the bit cell power supply wire 106 and the charge sharing wire 108. The bit cell power supply wire 106 provides the lowered CVDD bit cell power supply voltage to each of the bit cells 200 for write operations. As noted above, the bit cell power supply wire 106 and the charge sharing wire 108 are formed in different metal layers of the device 100 in some examples.

A transmission gate 306 is connected between the charge sharing wire 108 and the bit cell power supply wire 106, and is configured to selectively connect the charge sharing wire 108 and the bit cell power supply wire 106 to allow charge sharing between the wires in response to the enable signal and the memory address selection signal. An NMOS transistor 316 is connected between the ground terminal 304 and the charge sharing wire 108. A first inverter 310 is connected to receive the enable signal, LCVEN, via an enable signal terminal 318. The first inverter 310 is configured to output an enable bar signal LCVENB (inverse of the enable signal LCVEN) to the gate terminal of the NMOS transistor 316 to control the operation of the NMOS transistor 316 and selectively connect the charge sharing wire 108 to the ground terminal 304. A PMOS transistor 314 is connected between the power supply terminal 302 and the bit cell power supply wire 106. A NAND gate 308 is configured to receive the enable signal LCVEN via the enable signal terminal 318 as well as the memory address selection signal, DEC_LCVY[N−1:0], via a memory address selection signal terminal 320. The memory address signal DEC_LCVY[N−1:0] may be provided, for example, from the decoder 110 shown in FIG. 1. The NAND gate 308 is further configured to output a control signal, LCVPB[N−1:0].

A second inverter 312 is connected to receive the output signal LCVPB[N−1:0] from the NAND gate 308, and is configured to output the inverse of LCVPB[N−1:0], LCVP [N−1:0], to the gate terminal of the PMOS transistor 314 to control the operation of the PMOS transistor 314 and selectively connect the power supply wire 106 to the power supply terminal 302. The transmission gate 306 is connected to receive the complementary output signals from the NAND gate 308 and the second inverter 312, LCVPB[N−1:0] and LCVP[N−1:0], respectively. These signals selectively control the operation of the transmission gate 306. When active, the transmission gate 306 connects the bit cell power supply wire 106 to the charge sharing wire 108 to allow charge sharing between the wires. Thus, the circuit 102 is configured to selectively connect the bit cell power supply wire 106 to either the power supply input terminal 302 or the charge sharing wire 108 in response to the enable signal and the memory address selection signal. The bit cell power supply wire 106 and charge sharing wire 108 form a capacitor that functions to share the CVDD voltage when the charge sharing wire 108 and the power supply wire 106 are connected via the transmission gate 306, which lowers the CVDD voltage output to the bit cells 200 for write operations. In some embodiments, the address signal DEC_LCVY[N−1:0] is decoded from the memory address received by the decoder 110 to identify a particular column [0:N−1] of the array 104 that receives the bit cell power supply voltage CVDD. As will be disclosed further below, the LCV circuit 102 is also configured to connect the charge sharing wire 108 to the ground terminal 304 to discharge the capacitor formed by the power supply wire 106 and charge sharing wire 108.

Figure 4:
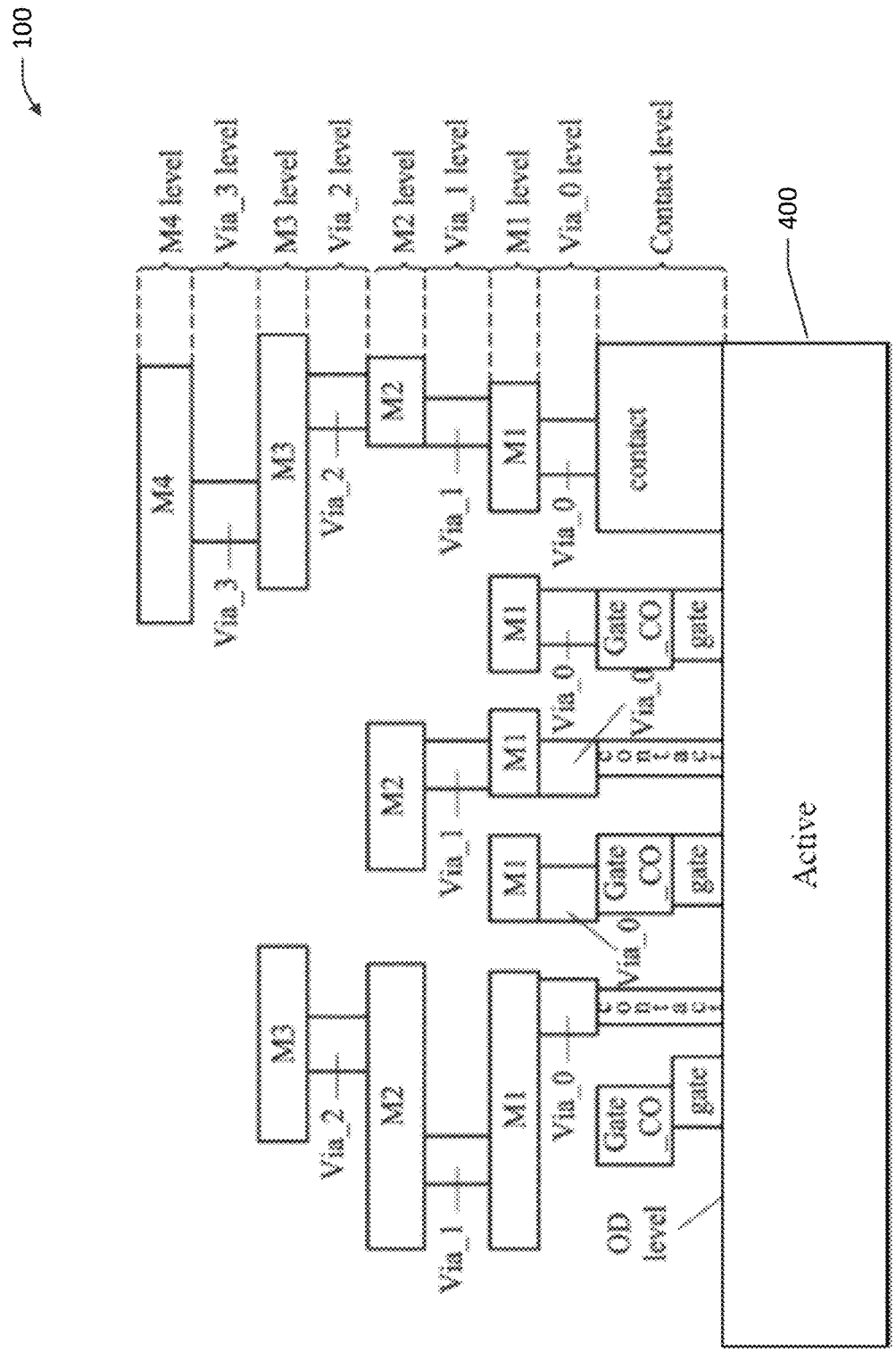
FIG. 4 is a block diagram illustrating examples of various layers of a memory device in accordance with some embodiments.

In some embodiments, the LCV circuit 102 uses otherwise unused metal layers of the device 100. FIG. 4 is a schematic cross-sectional view illustrating examples of various layers of a semiconductor device such as the memory device 100. It is noted that FIG. 4 is schematically illustrated to show various layers and levels of interconnect structures and transistors, and may not reflect each structure, layer, connection, etc. of the actual memory device 100. The example structure shown in FIG. 4 includes a contact level, an OD or "active region" level 400, various via levels Via_0, Via_1, Via_2, and Via_3, and a plurality of metal layers levels M1, M2, M3, and M4. The "active region" level 400 can include the substrate of the memory device 100. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated transistors of the memory cells 200 to an overlying level such as the Via_0 level, and source/drain contacts for connecting the source/drain regions of the transistors to the overlying level.

For example, the bit cell power supply wire 106, word lines 202, and bit lines 204 could be formed in the M1, M2, and/or M3 metal layers, while the charge sharing wire 108 could be formed another metal layer such as the M4 metal layer. In this manner, in some examples, the charge sharing wire 108 is formed over the various components of the memory array 104.

Moreover, in some examples, metal layers such as the metal layer M4 are otherwise unused in the memory device 100. As such, the charge sharing wire 108 may be the only structure formed in the respective metal layer. Thus, utilizing such unused layer(s) to implement the charge sharing wire 108 provides for minimal area cost to implement the LCV charge sharing write assist disclosed herein.

By utilizing otherwise unused metal layers over the memory array, the capacitance required for the charge sharing function of the LCV circuit 102 can be implemented without an additional area cost, thus allowing for a denser memory device with the benefits of lower power consumption and faster operation that the LCV write assist provides. Only one-time fixed amount expenses of charge are needed for a given LCV level during the charge sharing phase of each write operation. Metal wires parallel to the bit cell power wires have good capacitance matching for charge sharing among all memory density configurations, thus benefitting memory compiler design.

Figure 5:
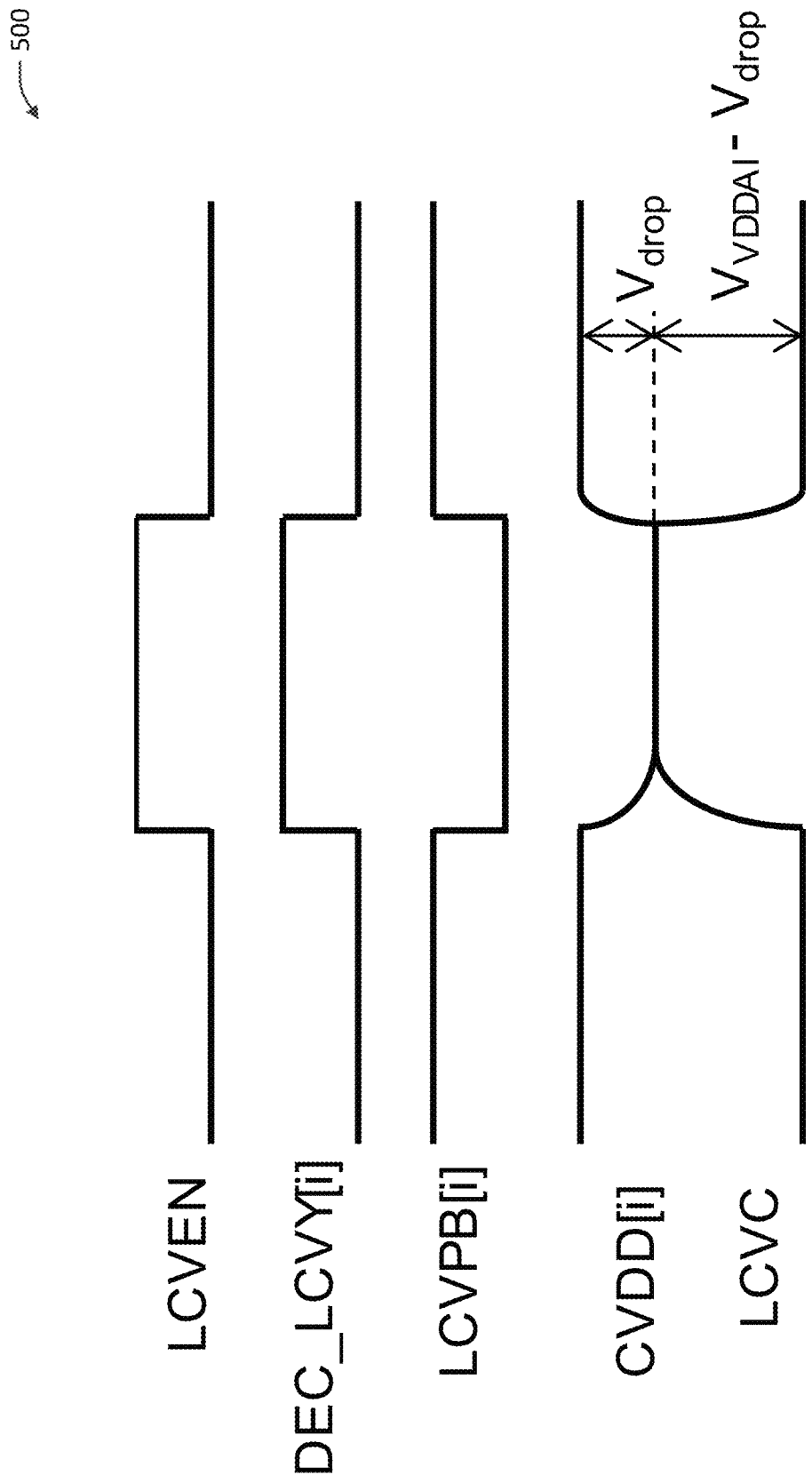
FIG. 5 is a graph depicting example waveforms of the charge sharing LCV circuit of FIG. 3 in accordance with some embodiments.

FIG. 5 is a waveform diagram 500 showing examples of signals of the LCV circuit 102. In some examples, a separate LCV circuit 102 is provided for each column [N−1:0] of the array 104. Accordingly, the NAND gate 308 of each LCV circuit 102 receives a memory address signal DEC_LCVY [N−1:0] corresponding to its respective column [i]. As shown in FIG. 5, the enable signal LCVEN and address signal DEC_LCVY[i] are initially low, resulting in the NAND gate 308 outputting a high LCVPB[i] signal. The high LCVPB[i] signal is received by the transmission gate 306, along with the inverted LCVPB[i] output by the inverter 312 as the low LCVP[i] signal. This turns the transmission gate 306 off, disconnecting the bit cell power supply wire 106 from the charge sharing wire 108. Further, the low LCVP[i] signal (inverted LCVPB[i] signal) output by the inverter 312 turns on the PMOS transistor 302, connecting the VDDAI voltage terminal 302 to the bit line power supply wire 106 to output the CVDD[i] bit cell supply voltage to the bit cells 200 of column [i] for read operations. Thus, the CVDD[i] voltage level shown in FIG. 5 is at the VDDAI level. The inverted enable signal LCVENB output by the inverter 310, turns on NMOS transistor 316, connecting the charge sharing wire 108 to the ground terminal 304, discharging the low cell voltage charge signal LCVC to ground.

When the enable signal LCVEN and the memory address selection signal for a particular column [i], DEC_LCVY[i] transition high for a write operation, the NAND gate 308 outputs LCVPB[i] as a low signal. The low LCVPB[i] signal (together with the high LCVP[i] signal output by the inverter 312) activates the transmission gate 306, connecting the bit cell power supply wire 106 and the charge sharing wire 108. The enable signal LCVEN is inverted by the inverter 310 to turn off the NMOS transistor 316, isolating the charge sharing wire 108 from ground. The inverted LCVPB[i] signal also turns off the PMOS transistor 314 to disconnect the charge sharing circuit 102 from the VDDAI terminal 302. The CVDD[i] charge on the bit cell power supply wire 106 is thus shared with the charge sharing wire 108 such that the voltage level of signal CVDD[i] drops by a value $V_{drop}$ from the supply voltage level of VDDAI as the charge sharing wire charges to the LCVC level defined by the VDDAI voltage less $V_{drop}$.

When the write assist cycle is complete, the enable signal LCVEN and address signal DEC_LCVY[i] go low to again turn off the transmission gate 306, disconnecting the bit cell power supply wire 106 and the charge sharing wire 108. The charge sharing wire 108 is connected to ground via the NMOS transistor 316 to discharge the LCVC signal on the charge sharing wire 108. The PMOS transistor 314 turns on to connect the VDDAI voltage to the bit line power supply line 106 and charge CVDD[i] back to the VDDAI voltage level. Thus, a lower power supply voltage CVDD[i] defined by VDDAI-$V_{drop}$ is supplied to the bit cells 200 during write operations, which provides for enhanced data writing operations.

Figure 6:
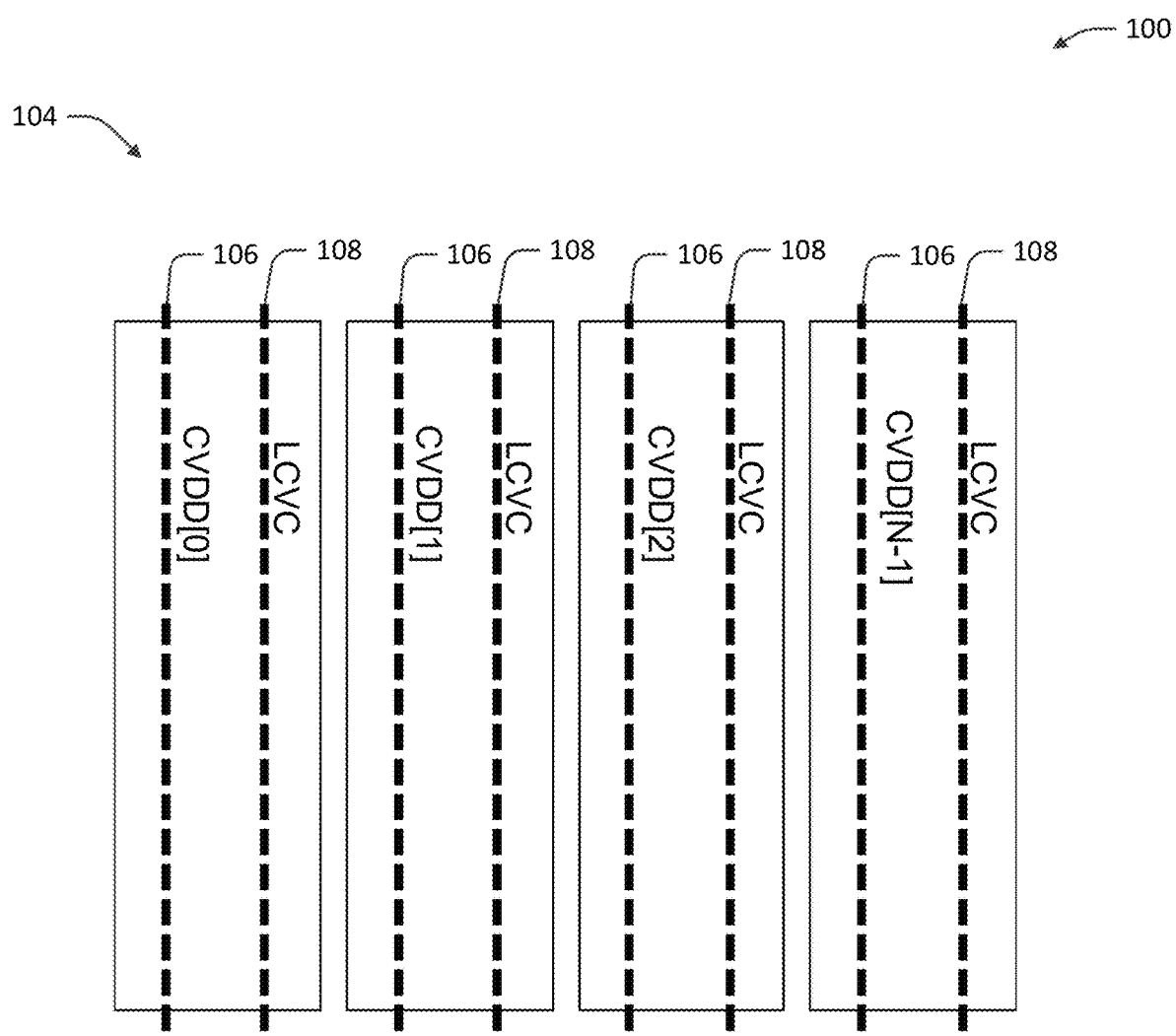
FIG. 6 is a block diagram illustrating aspects of a memory device with a charge sharing LCV circuit in accordance with some embodiments.

FIG. 6 illustrates an example of portions of the memory device 100 in accordance with some embodiments. The bit cell power supply wires 106 of each column[N−1:0] of the array 104 are connected to bit cells 200 of the respective columns. The bit cell power supply wires 106 are configured to supply power to the bit cells 200. Additionally, the charge sharing wire 108 extends in parallel to the bit cell power supply wires 106 of the array 104. As noted previously, the charge sharing wire 108 may be formed in an otherwise unused metal layer positioned over the array 104. The power supply wires 106 and charge sharing wires are connected to a charge sharing LCV circuit 102 as shown in FIG. 1. The LCV charge sharing circuit 102 can be a singular circuit servicing the entirety of the memory device 100, or can be a plurality of LCV charge sharing circuits 102 where each is connected to a respective column of bit cells 200 of the bit cell array 104, for example.

Moreover, the charge sharing wire 108 can be arranged parallel to the bit cell power supply wires 106 to provide good capacitance matching for charge sharing among various SRAM density configurations. As shown in FIG. 6, the charge sharing wire 108 is parallel to the bit cell power supply wire for each column [N−1:0] of the memory array 104. Equations 1 and 2 below describe the relationship between the capacitance and voltages of the bit cell power supply wire 106 and charge sharing wire 108. The capacitance and voltages of the charge sharing wire 108 and the bit cell power supply wire 106 can be compared by equating the currents in the wires as described in Equation 1, where the capacitance of the bit cell power supply wire for a particular column [i] ($C_{CVDD[i]}$) multiplied by $V_{drop}$ equals the capacitance of the charge sharing wire ($C_{LCVC}$) multiplied by the difference between the array power supply voltage VDDAI and $V_{drop}$ ($V_{VDDAI}$-$V_{drop}$).

$$C_{CVDD[i]} * V_{drop} = C_{LCVC} * (V_{VDDAI} - V_{drop}) \qquad (1)$$

By solving for $V_{drop}$, Equation 2 is obtained. $V_{drop}$ is defined as the ratio of $C_{LCVC}$ to the sum of $C_{CVDD[i]}$ and $C_{LCVC}$, wherein the ratio is multiplied by $V_{VDDAI}$.

$$V_{drop} = \frac{C_{LCVC}}{(C_{CVDD[i]} + C_{LCVC})} * V_{VDDAI} \quad (2)$$

Figure 7:
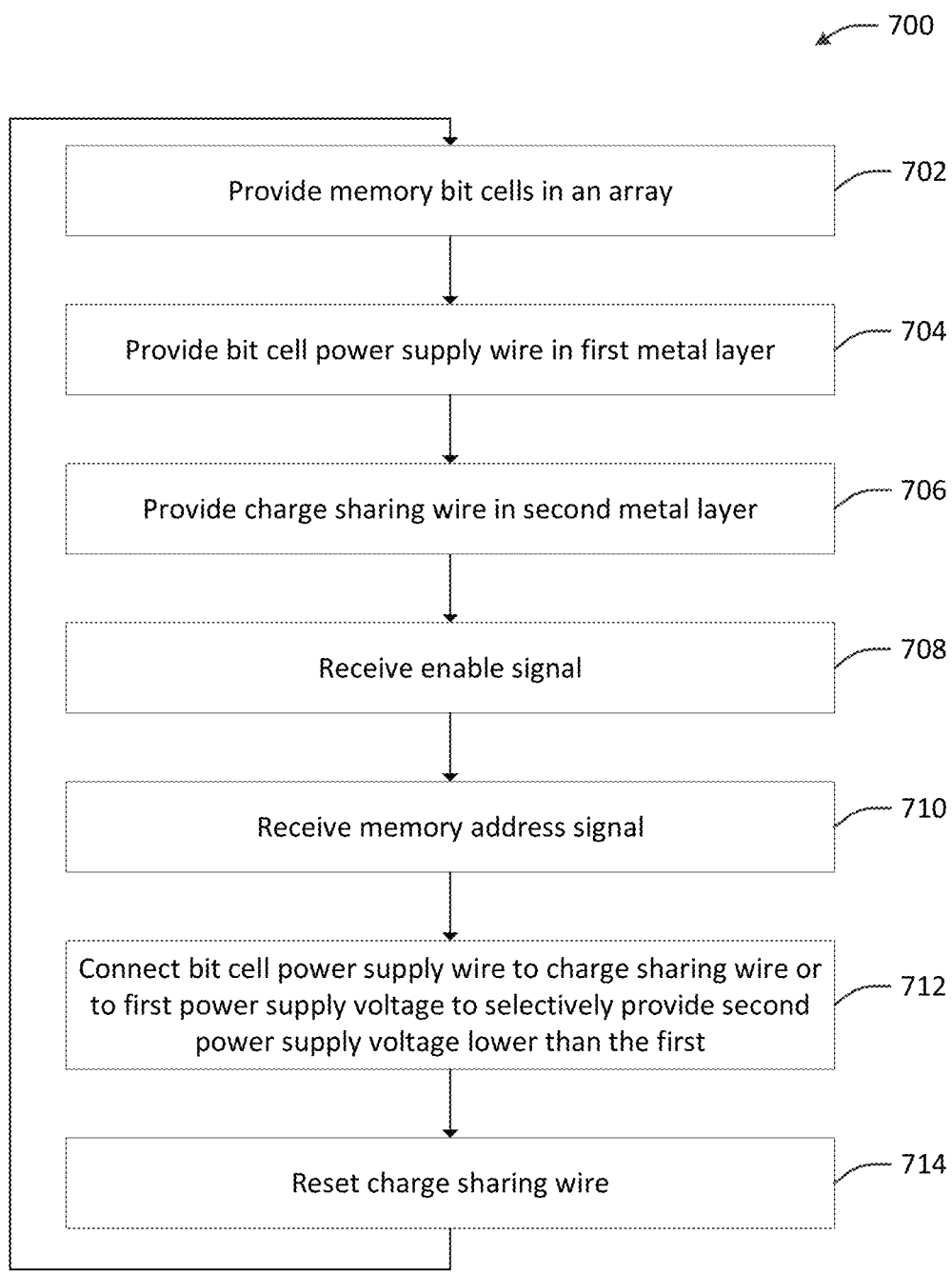
FIG. 7 is flow-chart depicting a charge sharing LCV method in accordance with some embodiments.

FIG. 7 is a flow chart describing a charge sharing write assist method 700 in accordance with aspects of the disclosure. An array 104 of memory cells 200 is provided in an operation 702. Referring to FIG. 7 together with FIGS. 1, 3 and 5, at operation 704 a bit cell power supply wire 106 is provided in a first metal layer, and at operation 706 a charge sharing wire 108 is provided in a second metal layer, where the second metal layer is above the first metal layer, and the first metal layer is between a substrate 400 and the second metal layer. At operation 708 an enable signal LCVEN is received by LCV circuit 102. In the example embodiments describe above, LCVEN is utilized to selectively enable the transmission gate 306 to initiate charge sharing, as well as to control the operation of NMOS transistor 316 to reset the charge sharing capacitance signal, LCVC, on the charge sharing wire 108. At operation 710 a memory address selection signal DEC_LCVY[N−1:0] is received by the memory device 100. As described above, DEC_LCVY[N−1:0] is received by the NAND gate 308, in addition to LCVEN, to control the transmission gate 306 to initiate charge sharing. DEC_LCVY[N−1:0] can be a decoder signal that selects the active column of the array 104. At operation 712 the bit cell power supply wire 106 is connected to the charge sharing wire 108 or to a first power supply voltage VDDAI based on the enable signal LCVEN and the memory address signal DEC_LCVY[N−1:0]. This facilitates selectively providing a second power supply voltage CVDD to the bit cells 200 on the bit cell power supply wire for write operations, where the second power supply voltage CVDD is less than the first power supply voltage VDDAI. At operation 714 the charge sharing wire 108 is reset to an initial value, such as ground for example.

Disclosed embodiments thus include an LCV control circuit that has a power supply input terminal and a power supply wire in a first metal layer that is connectable to at least one memory bit cell. A charge sharing wire is formed in a second metal layer. A control circuit is configured to selectively connect the power supply wire and the charge sharing wire to allow charge sharing between the power supply wire and the charge sharing wire, and provide a voltage on the power supply wire lower than an input voltage received on the power supply input terminal.

In accordance with further embodiments, a memory device includes a plurality of memory bit cells arranged in a memory array on a substrate. A power supply wire is formed in a first metal layer and is connected to each of the plurality of memory bit cells. A charge sharing wire is formed in a second metal layer arranged over the memory array so as to form a capacitor with the power supply wire. A power supply input terminal is connected to a control circuit that is configured to selectively connect the power supply wire to the power supply input terminal or the charge sharing wire.

In accordance with another embodiment, a method includes providing memory bit cells in an array. A bit cell power supply wire is provided in a first metal layer, and the bit cell power supply wire is connected to the bit cells. A charge sharing wire is provided in a second metal layer. An enable signal and a memory address signal are received. The bit cell power supply wire is connected to the charge sharing wire or a first power supply voltage based on the enable signal and the memory address signal, to selectively provide a second power supply voltage to the bit cells on the bit cell power supply wire lower than the first power supply voltage.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a power supply input terminal;
   a power supply wire in a first metal layer that is connectable to at least one memory bit cell;
   a charge sharing wire in a second metal layer; and
   a control circuit including:
      an enable signal terminal configured to receive an enable signal;
      a PMOS transistor connected between the power supply input terminal and the power supply wire; and
      a transmission gate connected between the power supply wire and the charge sharing wire;
      the control circuit configured to selectively connect the power supply wire and the charge sharing wire in response to the enable signal and a memory address selection signal to allow charge sharing between the power supply wire and the charge sharing wire, and provide a voltage on the power supply wire lower than an input voltage received on the power supply input terminal.

2. The circuit of claim 1, wherein the second metal layer is over the first metal layer.

3. The circuit of claim 2, wherein the charge sharing wire is the only structure formed in the second metal layer.

4. The circuit of claim 1, further comprising:
   a ground terminal;
   a first inverter connected to the enable signal terminal, configured to output the inverse of the enable signal; and
   an NMOS transistor connected between the ground terminal and the charge sharing wire, and having a gate terminal connected to receive the inverse of the enable signal from the first inverter to selectively connect the charge sharing wire to the ground terminal in response to the inverse enable signal.

5. The circuit of claim 2, wherein the charge sharing wire extends in parallel over the power supply wire.

6. The circuit of claim 1, further comprising a NAND gate configured to receive the enable signal and the memory address selection signal, further configured to output a control signal to the transmission gate.

7. The circuit of claim 6, further comprising a second inverter connected to receive the control signal from the NAND gate, and configured to output the inverse of the NAND gate control signal to the gate terminal of the PMOS transistor.

8. The circuit of claim 7, wherein the transmission gate is connected to receive the control signals of the NAND gate and the second inverter to selectively connect the power supply wire to the charge sharing wire.

9. A memory device, comprising:
a plurality of memory bit cells arranged in a memory array on a substrate;
a power supply wire in a first metal layer connected to each of the plurality of memory bit cells;
a charge sharing wire in a second metal layer arranged over the memory array so as to form a charge sharing capacitor with the power supply wire;
a power supply input terminal; and
a control circuit connected to the power supply input terminal and configured to selectively
connect the power supply wire to the power supply input terminal to connect an input voltage signal received on the power supply input terminal to the memory bit cells; or
connect the power supply wire to the charge sharing wire and the charge sharing capacitor to apply a reduced voltage lower than the input voltage signal to the memory bit cells.

10. The device of claim 9, wherein the power supply wire is between the substrate and the charge sharing wire.

11. The device of claim 9, further comprising a plurality of memory bit cell rows and columns in the memory array, wherein the power supply wire is connected to the memory bit cells in each of the columns.

12. The device of claim 9, further comprising a memory decoder configured to receive a memory address and output a memory address selection signal.

13. The device of claim 11, wherein:
the rows and columns of the memory array include a plurality of word lines and a plurality of bit lines perpendicular to the word lines;
the word lines are configured to select a row in response to the memory address selection signal;
the bit lines are configured to read data from and write data to the bit cells of the selected row; and
the charge sharing wire is parallel to the bit lines.

14. The device of claim 12, wherein the control circuit comprises:
an enable signal terminal configured to receive an enable signal;
a ground terminal;
a transmission gate connected between the power supply wire and the charge sharing wire;
an NMOS transistor connected between the ground terminal and the charge sharing wire;
a PMOS transistor connected between the power supply input terminal and the power supply wire;
a first inverter connected to the enable signal terminal and the NMOS transistor;
a NAND gate connected to the enable signal terminal and a memory address selection signal terminal; and
a second inverter connected to the NAND gate and the PMOS transistor.

15. The device of claim 14, wherein the control circuit is responsive to the memory address selection signal and the enable signal.

16. The device of claim 9, wherein the memory bit cells are 6 transistor SRAM cells.

17. A method, comprising:
providing memory bit cells in an array;
providing a bit cell power supply wire in a first metal layer, wherein the bit cell power supply wire is connected to the bit cells;
providing a charge sharing wire in a second metal layer to form a charge sharing capacitor with the bit cell power supply wire;
receiving an enable signal;
receiving a memory address signal;
in response to a first state of the enable signal and the memory address signal, connecting the bit cell power supply wire to a first power supply voltage terminal to supply the first power supply voltage to a selected bit cell; and
in response to a second state of the enable signal and the memory address signal, disconnecting the bit cell power supply wire from the first power supply voltage terminal and connecting the bit cell power supply wire to the charge sharing wire and the charge sharing capacitor to supply a voltage lower than the first power supply voltage to the selected bit cell.

18. The method of claim 17, further comprising connecting the charge sharing wire to ground to discharge the charge sharing capacitor in response to the first state of the enable signal.

19. The method of claim 17, further comprising disconnecting the charge sharing wire from the bit cell power supply wire in response to the first state of the enable signal.

20. The device of claim 9, wherein the charge sharing wire is the only structure formed in the second metal layer.

* * * * *